(12) United States Patent
    Umeda et al.

(10) Patent No.: US 10,893,603 B2
(45) Date of Patent: Jan. 12, 2021

(54) HEAT DISSIPATION SUBSTRATE, HEAT DISSIPATION CIRCUIT STRUCTURE BODY, AND METHOD FOR MANUFACTURING THE SAME

(71) Applicant: TATSUTA ELECTRIC WIRE & CABLE CO., LTD., Higashiosaka (JP)

(72) Inventors: Hiroaki Umeda, Kizugawa (JP); Kazuhiro Matsuda, Kizugawa (JP); Ken Yukawa, Kizugawa (JP)

(73) Assignee: TATSUTA ELECTRIC WIRE & CABLE CO., LTD., Higashiosaka (JP)

( * ) Notice: Subject to any disclaimer, the term of this patent is extended or adjusted under 35 U.S.C. 154(b) by 0 days.

(21) Appl. No.: 16/462,681

(22) PCT Filed: Dec. 6, 2017

(86) PCT No.: PCT/JP2017/043787
§ 371 (c)(1),
(2) Date: May 21, 2019

(87) PCT Pub. No.: WO2018/123480
PCT Pub. Date: Jul. 5, 2018

(65) Prior Publication Data
US 2020/0084875 A1    Mar. 12, 2020

(30) Foreign Application Priority Data
Dec. 28, 2016    (JP) .................................. 2016-256396

(51) Int. Cl.
*H05K 1/02*    (2006.01)
(52) U.S. Cl.
CPC ......... *H05K 1/0204* (2013.01); *H05K 1/0206* (2013.01); *H05K 1/0271* (2013.01)
(58) Field of Classification Search
CPC ... H05K 1/0204; H05K 1/0206; H05K 1/0271
See application file for complete search history.

(56) References Cited

U.S. PATENT DOCUMENTS

| 6,423,905 | B1* | 7/2002 | Brodsky | .............. | H05K 1/0271 |
| | | | | | 174/256 |
| 2006/0112544 | A1* | 6/2006 | Shuto | .................. | H01L 21/4857 |
| | | | | | 29/831 |

(Continued)

FOREIGN PATENT DOCUMENTS

| JP | 2003-338577 A | 11/2003 |
| JP | 2004-7024 A | 1/2004 |

(Continued)

OTHER PUBLICATIONS

International Search Report dated Mar. 6, 2018, issued in counterpart application No. PCT/JP2017/043787 (1 page).

*Primary Examiner* — Jacob R Crum
(74) *Attorney, Agent, or Firm* — Westerman, Hattori, Daniels & Adrian, LLP

(57) ABSTRACT

A heat dissipation substrate is disclosed including a base substrate having a first surface and a second surface, an electrically conductive path formed on the first surface, a through-hole penetrating from the first surface to the second surface, a heat dissipation member that is inserted into the through-hole and at least a part of which projects from the first surface, a thermally conductive resin constituent, covering a side surface of the heat dissipation member, that is present, without space, between an inner peripheral surface of the through-hole and an outer peripheral surface of the heat dissipation member surrounded by the inner peripheral surface, and a metal layer covering the heat dissipation member projecting from the first surface, in which an outer surface of the metal layer and an outer surface of the electrically conductive path are disposed on substantially the same plane.

11 Claims, 9 Drawing Sheets

(56) References Cited

U.S. PATENT DOCUMENTS

| | | | | |
|---|---|---|---|---|
| 2012/0037409 A1* | 2/2012 | Yamaguchi | ............... | H01B 1/22 |
| | | | | 174/257 |
| 2012/0279765 A1* | 11/2012 | Samejima | ............... | B32B 15/08 |
| | | | | 174/255 |
| 2013/0098669 A1* | 4/2013 | Yoshimura | ........... | H05K 1/0353 |
| | | | | 174/258 |
| 2015/0319840 A1* | 11/2015 | Sanada | ................... | H01L 23/13 |
| | | | | 361/709 |

FOREIGN PATENT DOCUMENTS

| JP | 2008-270511 A | 11/2008 |
|---|---|---|
| JP | 4988609 B2 | 8/2012 |
| JP | 2014-99544 A | 5/2014 |
| JP | 2015-185671 A | 10/2015 |

\* cited by examiner

HEAT DISSIPATION SUBSTRATE, HEAT DISSIPATION CIRCUIT STRUCTURE BODY, AND METHOD FOR MANUFACTURING THE SAME

TECHNICAL FIELD

The invention relates to a circuit substrate having a heat dissipation member, a heat dissipation circuit structure body having the circuit substrate, and a manufacturing method thereof.

BACKGROUND ART

In a substrate on which a power module, a high power LED, or the like is mounted, the function of dissipating heat is needed. For this purpose, a hole is conventionally provided in the substrate for heat dissipation of the substrate and a dissipation material is inserted into the hole as in the heat dissipation substrate disclosed in PTL 1.

As a method for manufacturing the heat dissipation substrate, for example, a dissipation material is inserted into the substrate and then fixed by applying a pressure from above to cause plastic deformation. However, since this method is manual work, the cost is likely to increase and causes a problem in that the dissipation material is removed because of a lack in pressure.

In addition, when the method described above is used, space is inevitably generated between the inner wall of the hole of the substrate and the dissipation material. Specifically, after the dissipation material is inserted into the substrate, a plating method is generally used to form a circuit pattern. In such a case, since a plating liquid enters the space between the inner wall of the hole of the substrate and the dissipation material, when the heat dissipation substrate is exposed to high heat after that, the residue (mainly water) of the plating liquid volatilizes, space is generated between the dissipation material and the substrate, and the adhesion between the dissipation material and the substrate degrades.

Accordingly, a technique for ensuring stable adhesion while reducing cost is needed.

CITATION LIST

Patent Literature

PTL 1: Japanese Patent No. 4988609

SUMMARY OF INVENTION

Technical Problem

The invention addresses the above problems with an object of providing a heat dissipation substrate and a heat dissipation circuit structure body capable of ensuring stable adhesion while reducing cost, and a manufacturing method thereof.

Solution to Problem

A heat dissipation substrate according to a first embodiment of the invention includes a base substrate including a first surface and a second surface; an electrically conductive path formed on the first surface; a through-hole penetrating from the first surface to the second surface; a heat dissipation member inserted into the through-hole, at least a part of the heat dissipation member projecting from the first surface; a thermally conductive resin constituent covering a side surface of the heat dissipation member, the thermally conductive resin constituent being present, without space, between an inner peripheral surface of the through-hole and an outer peripheral surface of the heat dissipation member surrounded by the inner peripheral surface; and a metal layer covering the heat dissipation member projecting from the first surface, in which an outer surface of the metal layer and an outer surface of the electrically conductive path are disposed on substantially the same plane.

The heat dissipation member may project from the second surface of the base substrate.

A heat dissipation circuit structure body according to the invention includes the heat dissipation substrate; and an electronic component connected to the electrically conductive path and the metal layer of the heat dissipation substrate.

A method for manufacturing a heat dissipation substrate according to the invention includes a process of obtaining a metal laminated body by providing a first metal film on a first surface of a base substrate including the first surface and a second surface; a process of forming a through-hole penetrating through the metal laminated body from an outer surface of the first metal film of the metal laminated body to the second surface of the base substrate; a process of achieving a state in which a heat dissipation member is inserted into the through-hole, a part of the heat dissipation member projects from the outer surface of the first metal film, a thermally conductive resin constituent is present, without space, between an inner peripheral surface of the through-hole and the heat dissipation member, and a side surface of the heat dissipation member is covered with the thermally conductive resin constituent; a process of hardening the thermally conductive resin constituent; a process of performing machining so that an outer surface of the first metal film, an outer surface of the thermally conductive resin constituent, and an outer surface of the heat dissipation member are disposed on substantially the same plane; a process of forming a second metal film that covers a surface of the first metal film, a surface of the heat dissipation member, and a surface of the thermally conductive resin constituent; and a process of providing an electrically conductive path and a metal layer covering the outer surface of the heat dissipation member by removing a part of the second metal film to form an arbitrary pattern.

Advantageous Effects of Invention

In the heat dissipation substrate according to the invention, the heat dissipation member can be easily fixed to the through-hole provided in the base substrate and, even when an electrically conductive path or the like is formed on the base substrate by plating, adhesion between the heat dissipation member and the base substrate does not degrade. Accordingly, it is possible to eliminate a problem such as removal of the heat dissipation member caused when the heat dissipation substrate is exposed to a high temperature environment. In addition, since it is possible to form an electrically conductive path and a metal layer through which heat generated from an electronic component is dissipated on the base substrate so that the surfaces thereof are disposed on substantially the same plane, an electrically conductive circuit can be formed with an additive method such as plating, the metal layer can be provided, and the heat dissipation substrate can be manufactured efficiently.

DESCRIPTION OF EMBODIMENTS

Embodiments of the invention will be described more specifically below.

Figure 1:
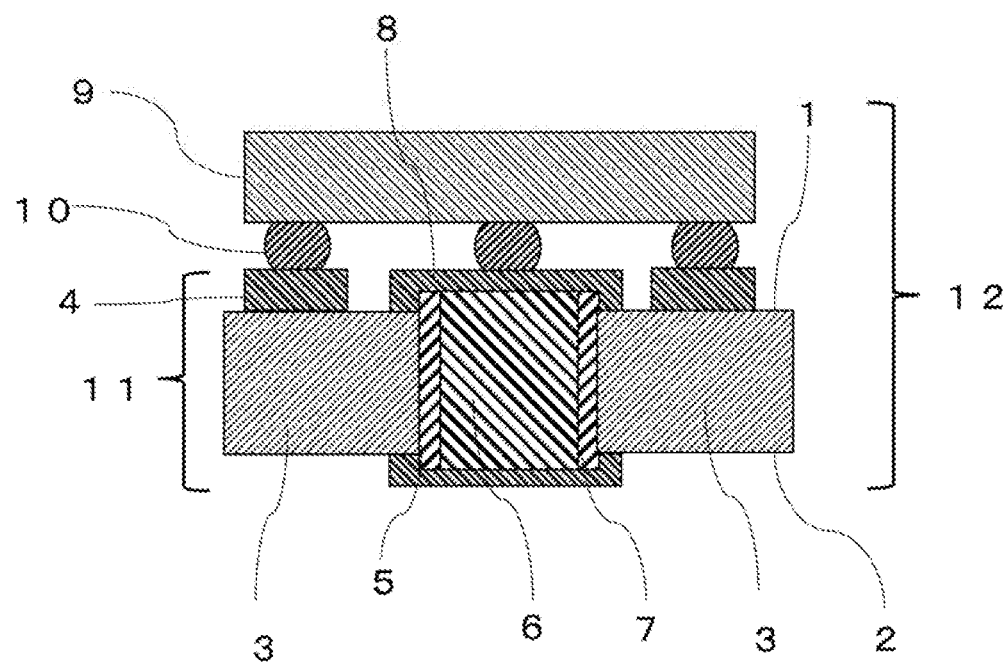
FIG. 1 is a schematic cross sectional view illustrating a heat dissipation circuit structure body according to a first embodiment of the invention.
Figure 2:
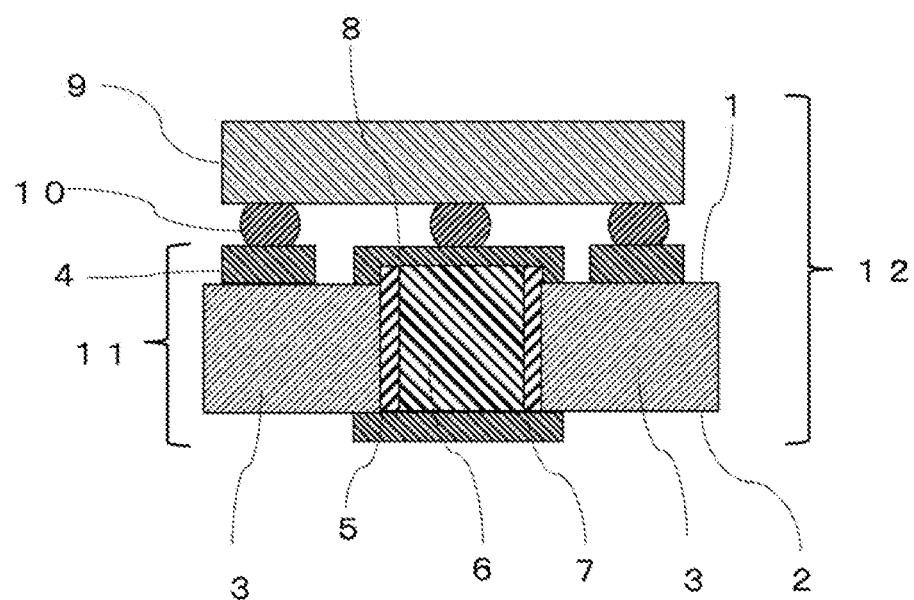
FIG. 2 is a schematic cross sectional view illustrating a heat dissipation circuit structure body according to a modification of the first embodiment of the invention.
Figure 3:
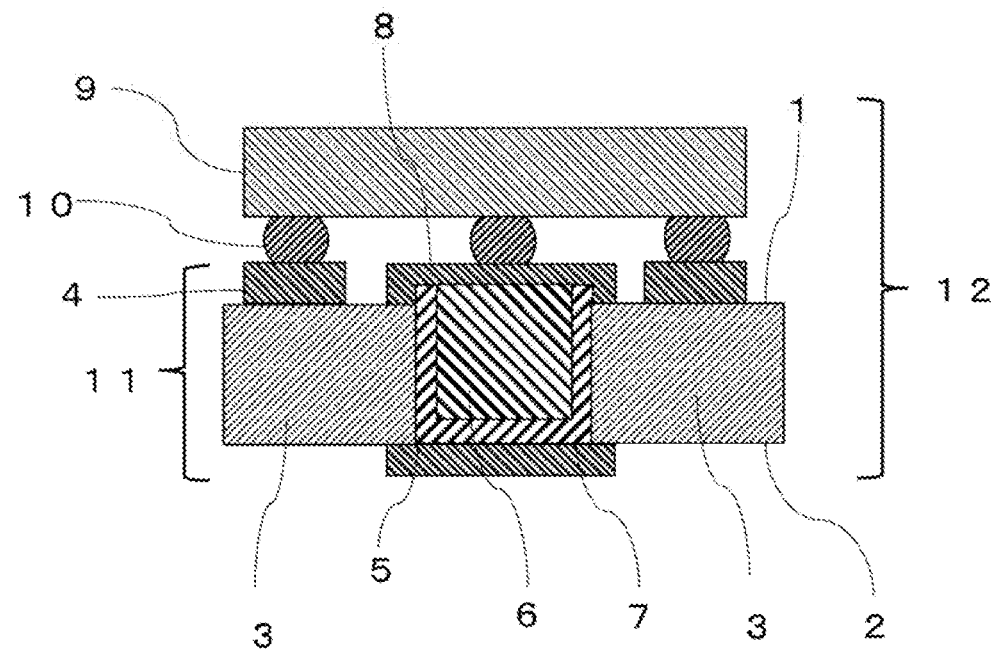
FIG. 3 is a schematic cross sectional view illustrating a heat dissipation circuit structure body according to a modification of the first embodiment of the invention.

FIGS. 1 to 3 illustrate a heat dissipation circuit structure body 12 according to a first embodiment of the invention configured by connecting a heat dissipation substrate 11 and an electronic component 9 to each other. In the heat dissipation substrate 11, an electrically conductive path 4 and a metal layer 8 are connected to the electronic component 9 via a low-melting metal 10.

As illustrated in these drawings, the heat dissipation substrate 11 according to the embodiment includes a base substrate 3 having a first surface 1 and a second surface 2, the electrically conductive path 4 formed on the first surface, a through-hole 5 penetrating from the first surface 1 to the second surface 2, a heat dissipation member 6 that is inserted into the through-hole 5 and at least a part of which projects from the first surface 1, a thermally conductive resin constituent 7, covering a side surface of the heat dissipation member 6, that is present, without space, between an inner peripheral surface of the through-hole 5 and an outer peripheral surface of the heat dissipation member 6 surrounded by the inner peripheral surface, and the metal layer 8 covering the heat dissipation member 6 projecting from the first surface 1, in which an outer surface of the metal layer 8 and an outer surface of the electrically conductive path 4 are disposed on substantially the same plane.

The material of the base substrate 3 is not particularly limited and thermosetting resin or thermoplastic resin may be used, but thermosetting resin is preferable in terms of heat resistance.

The thermosetting resin may be, for example, epoxy resin, acrylic resin, polyurethane resin, polyurethane urea resin, polyester resin, polyamide resin, polyamide imide resin, polyimide resin, polycarbonate resin, alicyclic olefin resin, polyphenylene ether resin, phenoxy resin, maleimide resin, polyimide benzoxazole resin, polybenzoxazole resin, polyester amide resin, polyester imide resin, vinyl ester resin, polyacetal resin, polyether ketone resin, polyether ether ketone resin, polyfumarate resin, benzoxazine resin, carbodiimide resin, fluororesin, polyolefin resin, silicone resin, and the like. One of them may be used solely or two or more of them may be used together.

The thermoplastic resin may be, for example, polyamide resin, liquid crystal polymer resin, methacrylic resin, acrylic resin, polystyrene, polyester, polyurethane, polycarbonate, butadiene rubber, ester amide, isoprene rubber, cellulose, phenoxy resin, polyvinyl acetal resin, polyimide resin, polyamide imide resin, and the like. One of them may be used solely or two or more of them may be used together.

The electrically conductive path 4 is formed on the first surface 1 of the base substrate 3. The electrically conductive path 4 is formed to connect the plurality of electronic components 9 mounted on the base substrate 3, transmit a signal, or interlayer-connect the plurality of base substrates 3 to each other.

The material of the electrically conductive path 4 is not particularly limited, but an electrically conductive material such as copper foil may be used.

In addition, the electrically conductive path 4 may also be formed on the second surface 2 as necessary.

The through-hole 5 is provided so as to penetrate through the base substrate 3 from the first surface 1 to the second surface 2. A layer made of an electrically conductive substance as in so-called through-hole plating may be provided in at least a part of the inner wall of the through-hole 5.

The inner wall (layer of an electrically conductive substance when the layer is provided) of the through-hole 5 makes contact with the thermally conductive resin constituent 7 and all side surfaces of the heat dissipation member 6 are covered with the thermally conductive resin constituent 7. That is, since the inside of the through-hole 5 is filled with the thermally conductive resin constituent 7 and the side surfaces of the heat dissipation member 6 are completely covered with the thermally conductive resin constituent 7, the heat dissipation member 6 is connected to the thermally conductive resin constituent 7 without space and the thermally conductive resin constituent 7 is connected to the inner wall of the through-hole 5 without space.

Since no space is present, when the metal layer 8 is formed by plating, it is possible to prevent volatile components such as a plating liquid from entering the space between the heat dissipation member 6 and the thermally conductive resin constituent 7 and the space between the thermally conductive resin constituent 7 and the inner wall of the through-hole 5. Accordingly, even when the heat dissipation substrate 11 is exposed to high temperature, it is possible to prevent the heat dissipation member 6 from being removed from the heat dissipation substrate 11 due to expansion of volatile components.

In addition, the heat dissipation member 6 and the thermally conductive resin constituent 7 project from the first surface 1 and the projecting parts of the heat dissipation member 6 and the thermally conductive resin constituent 7 are covered with the metal layer 8. In addition, at least a part of the projecting part of the heat dissipation member 6 is not covered with the thermally conductive resin constituent 7 and makes direct contact with the metal layer 8.

Since the projecting parts of the heat dissipation member 6 and the thermally conductive resin constituent 7 are covered with the metal layer 8 and at least a part of the heat dissipation member 6 makes direct contact with the metal layer 8, heat generated from the electronic component is easily conducted to the heat dissipation member 6 via the metal layer 8, heat can be efficiently emitted from the heat dissipation substrate 11.

In addition, on the side of the second surface, the heat dissipation member 6 and the thermally conductive resin constituent 7 may also project from the second surface 2 as illustrated in FIG. 1 or may be formed on substantially the same plane as the second surface 2 as illustrated in FIG. 2. Alternatively, the heat dissipation member 6 does not need to be exposed to the side of the second surface and the thermally conductive resin constituent 7 and the second surface 2 may be formed on substantially the same plane as illustrated in FIG. 3.

The shape in plan view of the through-hole 5 is not particularly limited and may be circular, elliptic, or polygonal, but the shape is preferably circular.

The opening diameter of the through-hole 5 is not particularly limited and may be selected as appropriate according to the size of the electronic component 9 to be placed or the like.

When a layer made of an electrically conductive substance is provided on the inner wall of the through-hole 5, the material included in the layer may be metal such as copper, silver, gold, or the like. Of these metals, copper is preferable in that through-hole plating can be achieved at low cost using a known plating process.

The heat dissipation member 6 according to the invention is formed by a material having good thermal conductivity. Such a material is not particularly limited as long as the material has been used conventionally for similar purposes. A specific example thereof is metal such as copper, porous copper, iron, or nickel, or a carbon molded article.

In addition, the thermal conductivity of the heat dissipation member 6 is not particularly limited, but the thermal conductivity is preferably equal to or more than 100 W/m·K and more preferably equal to or more than 200 W/m·K.

The carbon molded article is not particularly limited, but the article may be, for example, a hybrid material of carbon and carbon fiber.

The shape of the heat dissipation member 6 is not particularly limited, but the shape is preferably columnar, for example, cylindrical in normal cases. In addition, the shape in plan view of the heat dissipation member 6 is preferably substantially the same as the shape in plan view of the through-hole 5.

The thermally conductive resin constituent 7 according to the invention is not limited to this example and may include a resin component including epoxy resin, a curing agent, and an inorganic filler.

One type or two or more types of resin selected from solid epoxy resin and liquid epoxy resin may be used as the epoxy resin.

Here, the "solid epoxy resin" is assumed to be epoxy resin that is solid at room temperature (25° C.). The solid epoxy resin is not particularly limited as long as an epoxy group is included in a molecule and the solid state is kept at room temperature (25° C.). A specific example thereof may be trisphenol epoxy resin, trisphenol methane epoxy resin, bisphenol A epoxy resin, phenol novolac epoxy resin, or the like.

In addition, the liquid epoxy resin is not particularly limited as long as an epoxy group is included in a molecule and the liquid state is kept at room temperature (25° C.). A specific example thereof may be bisphenol A epoxy resin, bisphenol F epoxy resin, glycidyl amine-based epoxy resin, glycidyl ether-based epoxy resin, or the like.

Although the solid epoxy resin and liquid epoxy resin may be used solely, the solid epoxy resin and the liquid epoxy resin are preferably used together.

Of the total amount (100 parts by mass) of the solid epoxy resin and the liquid epoxy resin, the formulation amount of solid epoxy resin is not limited to this, but the formulation amount is preferably 20 to 90 parts by mass and more preferably 40 to 80 parts by mass. When the formulation amount is 20 parts by mass or more, tackiness does not remain after the agent dries and treatment becomes easy. In the case of 90 parts by mass or less, since the agent does not easily vaporize, a film is not easily generated on the surface of the paste and application to a dissipation material becomes easy.

In the thermally conductive resin constituent 7 according to the embodiment, a bismaleimide compound can be used in addition to solid epoxy resin and liquid epoxy resin as the resin component.

The compound represented by the following general formula (I) can be used as the bismaleimide compound.

[Chemical 1]

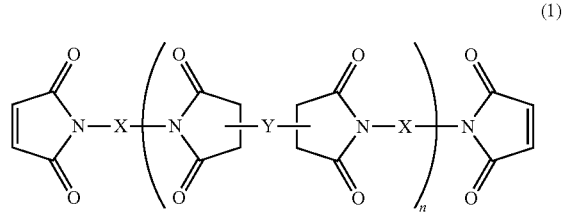

(1)

In formula (I), X represents an aliphatic, alicyclic, or aromatic hydrocarbon group having 10 to 30 carbon atoms in the main chain and these groups may have hetero atoms, substituent groups, or siloxane skeletons. X is preferably an aliphatic hydrocarbon group, an alicyclic hydrocarbon group, or an aliphatic hydrocarbon group modified with an alicyclic hydrocarbon group, more preferably an aliphatic hydrocarbon group having 10 to 55 carbon atoms, and even more preferably 10 to 40 carbon atoms.

Y represents an aliphatic, alicyclic, or aromatic hydrocarbon group and these groups may have hetero atoms, substituent groups, phenyl ether skeletons, sulfonyl skeletons, siloxane skeletons. Y is preferably an aromatic hydrocarbon group.

Figure 11:
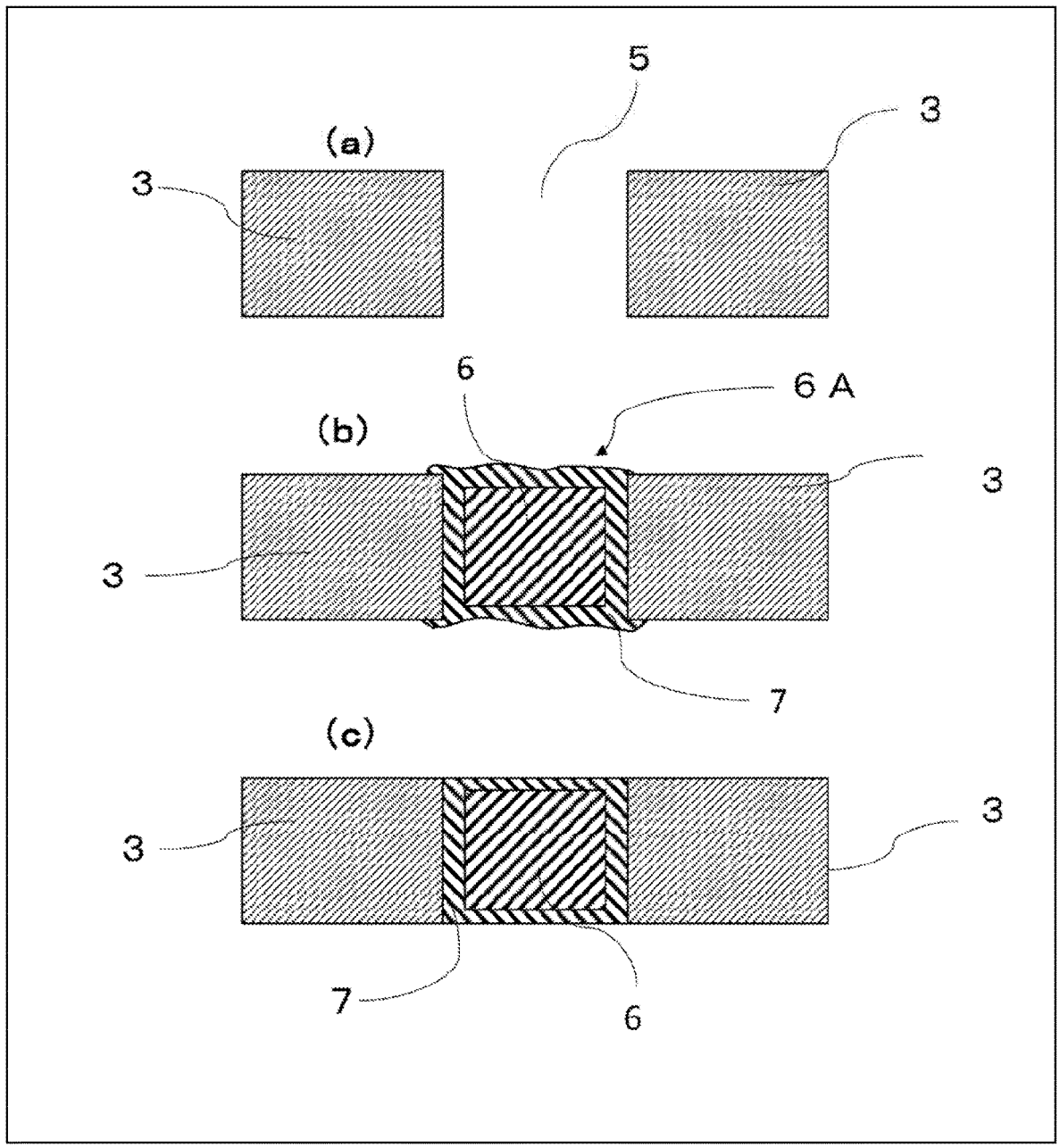
FIG. 11 is a schematic view illustrating an example of a method for manufacturing a heat dissipation substrate according to the invention.

In addition, n represents the number of repeating units and ranges from 1 to 20. When n is 1 or more, a thermally conductive resin constituent-covered heat dissipation member (6A in FIG. 11) capable of ensuring stable adhesion is easily obtained. In addition, n is preferably 20 or less and more preferably 10 or less. When n is 20 or less, the thermally conductive resin constituent-covered heat dissipation member capable of ensuring stable adhesion is easily obtained. One type of a bismaleimide compound having n from 1 to 20 may be used solely or two or more types of bismaleimide compounds may be used together and a mixture of bismaleimide compounds having n from 1 to 10 is more preferable.

Since a mixture of bismaleimide compounds having n from 1 to 10 improves the vibration resistance, the compounds are preferably applied to a base substrate used for products such as automobiles undergoing high vibrations.

The method for manufacturing the bismaleimide compound described above is not particularly limited and may be a known method that performs, for example, a condensation reaction between acid anhydride and diamine and then performs cyclization (imidization) by anhydration.

The bismaleimide compound described above may be a commercially available compound and, as a preferable example, may be BMI-3000 (synthesized by dimer diamine, pyromellitic dianhydride, and maleic anhydride), BMI-1500, BMI-2550, BMI-1400, BMI-2310, or BMI-3005 manufactured by DESIGNERMOLECURES Inc.

Of the compounds described above, BMI-3000 manufactured by DESIGNERMOLECURES Inc., which is the bismaleimide compound used particularly preferably in the invention is represented by the following constitutional formula. In this formula, n ranges from 1 to 20.

[Chemical 2]

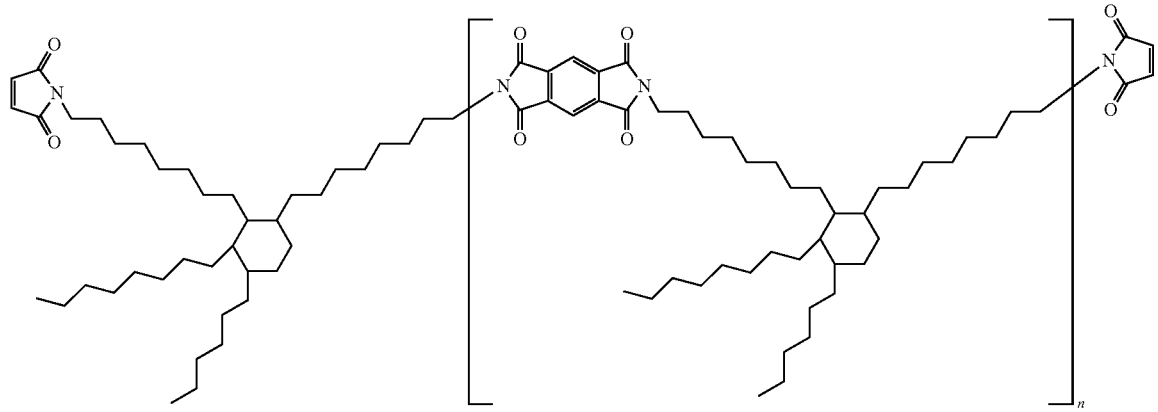

When a bismaleimide compound is used, the formulation amount of the bismaleimide compound is not limited to this, but the formulation amount is preferably 5 to 20 parts by mass among 100 parts by mass of resin component.

The curing agent described above is not particularly limited, but one agent selected from a group including an imidazole-based curing agent, a cation-based curing agent, and a radical curing agent may be used solely or two or more of these agents may be blended and used.

The imidazole-based curing agent may be, imidazole, 2-undecylimidazole, 2-heptadecylimidazole, 2-ethyl imidazole, 2-phenylimidazole, 2-ethyl-4-methyl imidazole, 1-cyanoethyl-2-undecylimidazole, 2-phenylimidazole, 2,4-diamino-6-[2'-methyl imidazolyl-(1')]-ethyl-s-triazine or the like. The electrical conductivity and heat dispersion characteristics can be improved by using an imidazole-based curing agent as the curing agent.

The cation-based curing agent may be an onium-based compound typified by amine salt of boron trifluoride, P-methoxybenzene diazonium hexafluorophosphate, diphenyliodonium hexafluorophosphate, triphenylsulfonium, tetra-n-butyl phosphonium tetraphenylborate, tetra-n-butyl phosphonium-o, o-diethyl phosphorodithioate, or the like.

The radical curing agent (polymerization initiator) may be dicumyl peroxide, t-butyl cumyl peroxide, t-butyl hydroperoxide, cumene hydroperoxide, azo-based compound, or the like.

The formulation amount of the curing agent is not particularly limited, but the formulation amount is preferably 0.5 to 30 parts by mass, more preferably 1 to 20 parts by mass, and still more preferably 3 to 15 parts by mass relative to 100 parts by mass of the resin component.

The inorganic filler described above is also not particularly limited, but may be, for example, metal powder such as gold, silver, copper, or nickel, alloy powder including two or more metals selected from gold, silver, copper, and nickel, silver-coated copper powder, gold-coated copper powder, silver-coated nickel powder, gold-coated nickel powder, a carbon material such as graphene or carbon, silica, alumina, nitrogen boron, or the like. One of these inorganic fillers may be used solely or two or more of them may be blended and used.

The inorganic filler described above is preferably selected so as to obtain desired electrical conductivity, heat dissipation characteristics, or linear expansion coefficient. When conductivity between the heat dissipation member 6 and through-hole plating is necessary, metal powder such as gold, silver, copper, or nickel, alloy powder including two or more metals selected from gold, silver, copper, and nickel, silver-coated copper powder, gold-coated copper powder, silver-coated nickel powder, gold-coated nickel powder, graphene, or carbon is preferably used. When electrical conductivity is not necessary, silica, alumina, or boron nitride may be used.

The formulation amount of the inorganic filler is not particularly limited, but the formulation amount is preferably 20 to 75 vol %, more preferably 20 to 70 vol %, and still more preferably 30 to 65 vol % relative to the total amount of the resin component, the curing agent, and the inorganic filler.

The thermally conductive resin constituent 7 can be obtained by sufficiently mixing the components described above with a solvent used as necessary.

The solvent is not particularly limited, but an organic solvent is preferably used and a specific example thereof is methyl ethyl ketone, toluene, methanol, tetralin, or the like. One of these solvents may be used solely or two or more of them may be blended and used.

The formulation amount of the solvent is not particularly limited, but the formulation amount is preferably 20 to 300 parts by mass, more preferably 40 to 200 parts by mass, and still more preferably 50 to 150 parts by mass relative to 100 parts by mass of the resin component.

It should be noted here that an additive having been often added to a thermally conductive resin constituent similar to the thermally conductive resin constituent 7 may be added to the thermally conductive resin constituent 7 without departing from the object of the invention.

The thermally conductive resin constituent 7 described above preferably has a complex viscosity of $1 \times 10^2$ Pa·s to $5 \times 10^6$ Pa·s at 80° C. when the solvent is not included and more preferably has a complex viscosity of $1 \times 10^2$ Pa·s to $1 \times 10^6$ Pa·s by selecting the types and adjusting amounts of the formulated components described above.

As described later, after the heat dissipation member 6 is inserted via the thermally conductive resin constituent 7 into the through-hole 5 provided in the base substrate 3, the thermally conductive resin constituent 7 can be hardened by being pressed while being heated. At this time, when the complex viscosity at 80° C. is $1 \times 10^2$ Pa·s or larger, it is possible to prevent the thermally conductive resin constituent 7 from flowing out excessively through the space between the heat dissipation member 6 and the base substrate 3 and easily ensure the adhesive strength between the base substrate 3 and the heat dissipation member 6. In addition, when the complex viscosity at 80° C. is $5 \times 10^6$ Pa·s or less, the diffluence of the thermally conductive resin constituent 7 becomes appropriate, space is not easily generated between the heat dissipation member 6 and the base substrate 3, and the adhesive strength between the heat dissipation member 6 and the base substrate 3 can be easily ensured.

At an intermediate stage (FIG. 8(d)) of the manufacturing process described later, the surfaces of a metal film A, the heat dissipation member 6, and the thermally conductive resin constituent 7 on which a metal film A' is formed are formed on substantially the same plane. Since these surfaces are disposed on substantially the same plane, the metal film A' (that becomes the electrically conductive path 4 and the metal layer 8 later) to be formed thereon easily becomes flat. Since the metal film A' becomes flat, the electrically conductive path 4 and the metal layer 8 to be formed by etching or the like can be disposed on substantially the same plane. Accordingly, when the electronic component 9 is connected to the electrically conductive path 4 and the metal layer 8 via the low-melting metal 10, the distance between the electronic component 9 and the electrically conductive path 4 and the distance between the electronic component 9 and the metal layer 8 become even.

When the distance between the electronic component 9 and the electrically conductive path 4 and the distance between the electronic component 9 and the metal layer 8 become uneven, the resistance value between the electronic component 9 and the electrically conductive path 4 and/or the resistance value between the electronic component 9 and the metal layer 8 increase or the thermal conduction between them degrade.

Figure 7:
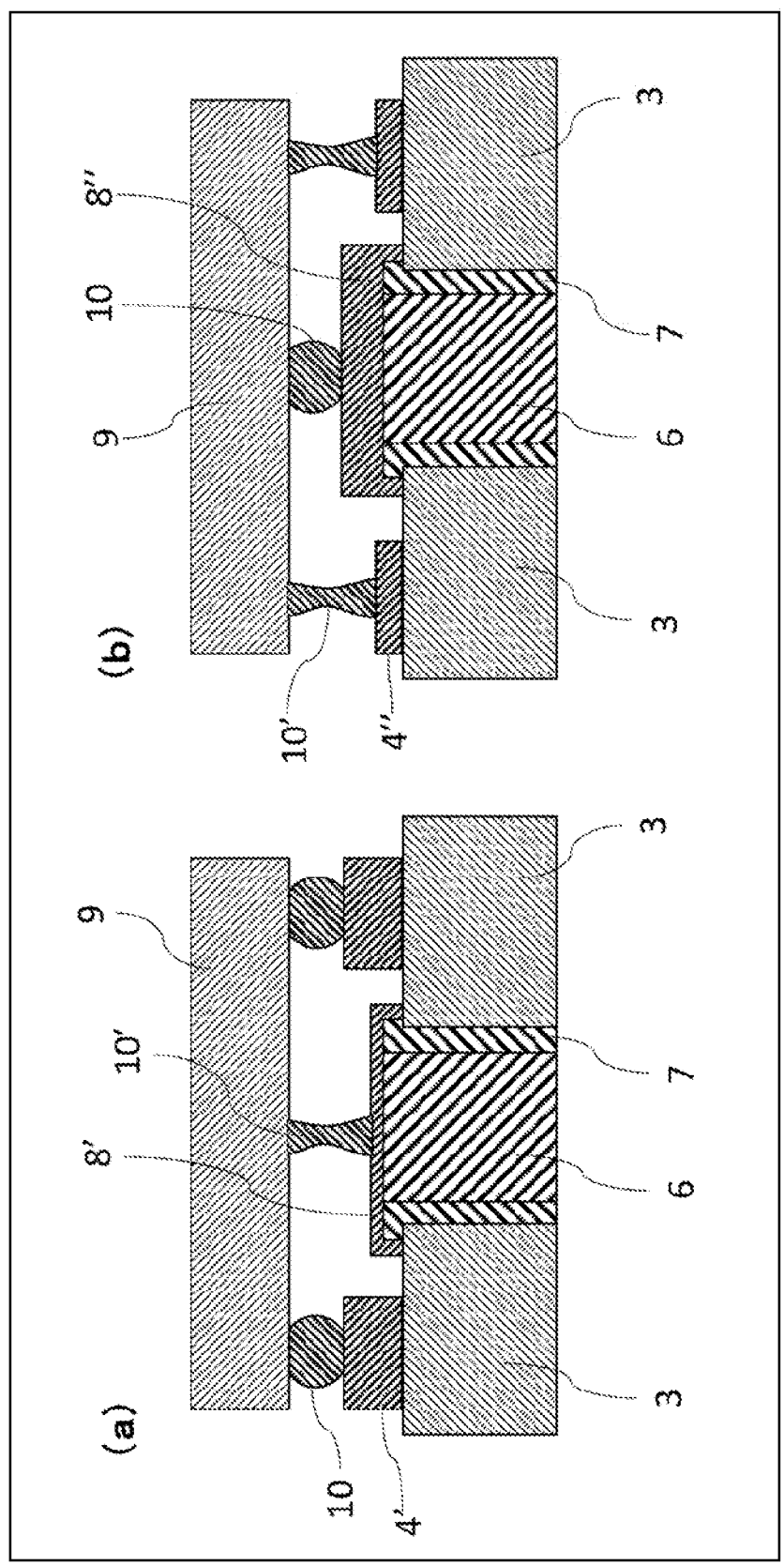
FIG. 7 is a schematic cross sectional view illustrating an aspect in which heat dissipation characteristics and connection stability degrade when the heat dissipation circuit structure body is exposed to a high temperature environment.

Specifically, when the distance between the electronic component 9 and a metal layer 8' is larger than the distance between the electronic component 9 and an electrically conductive path 4' as illustrated in FIG. 7(a), if the electronic component 9 is connected to the metal layer 8' by a solder reflow using the low-melting metal 10, a low-melting metal 10' formed between the electronic component 9 and the metal layer 8' becomes thin due to a surface tension. Accordingly, the resistance value increases or the heat conduction from the electronic component 9 to the metal layer 8' degrades when exposed to a high temperature environment.

In addition, when the distance between the electronic component 9 and an electrically conductive path 4" is larger than the distance between the electronic component 9 and a metal layer 8" as illustrated in FIG. 7(b), the problem as described above occurs and, if the electronic component 9 is connected to the electrically conductive path 4" by a solder reflow using the low-melting metal 10, the low-melting metal 10' formed between the electronic component 9 and the electrically conductive path 4" becomes thin.

The amount of the low-melting metal 10 needs to be increased to prevent the low-melting metal 10 from becoming thin, thereby increasing the cost.

In contrast, since the metal film A, the heat dissipation member 6, and the thermally conductive resin constituent 7 are formed on substantially the same plane in the invention, the surfaces of the electrically conductive path 4 and the metal layer 8 to be formed thereon are also disposed on substantially the same plane. Accordingly, a problem as described above does not occur and the electronic component 9 can be connected to the electrically conductive path 4 and the metal layer 8 via the minimum amount of the low-melting metal 10.

The material included in the metal layer 8 may be the same material as the electrically conductive path 4.

In addition, the metal layer 8 only needs to cover at least a part of the through-hole 5, the heat dissipation member 6, and the thermally conductive resin constituent 7 in plan view of the first surface 1 and preferably covers all of the through-hole 5, the heat dissipation member 6, and the thermally conductive resin constituent 7. When the metal layer 8 is formed as described above, heat generated from the electronic component 9 is easily conducted to the thermally conductive resin constituent 7 and the heat dissipation member 6 efficiently without a loss.

In addition, the metal layer 8 is preferably formed on the second surface so as to cover at least a part of the through-hole 5, the heat dissipation member 6, and the thermally conductive resin constituent 7 and, if the metal layer 8 is formed, dissipation effects are further improved.

Next, the heat dissipation circuit structure body according to the invention will be described. In the heat dissipation circuit structure body 12 according to the embodiment illustrated in FIG. 1, the metal layer 8 of the heat dissipation substrate 11 according to the invention described above is connected to the electronic component 9 via the low-melting metal 10.

Since the metal layer 8 is connected to the electronic component 9, heat generated from the electronic component 9 can be conducted effectively to the thermally conductive resin constituent 7 and the heat dissipation member 6 via the metal layer 8.

In addition, when the metal layer 8 is connected to the electronic component 9 via the low-melting metal 10, since the low-melting metal 10 has good heat conduction efficiency, heat generated from the electronic component 9 can be dissipated from the base substrate 3 via the thermally conductive resin constituent 7 and the heat dissipation member 6. Connection via the low-melting metal 10 can be made using a conventional solder reflow process.

Metal particles of at least one selected from a group including indium, tin, lead, and bismuth may be used as the low-melting metal 10 as described above. One of them may be used solely or two or more of them may be used together.

Of these metals, soldering is preferably used in terms of the availability of the conventional solder reflow process.

In addition, the low-melting metal 10 may be a paste-like constituent including the metal particles as described above. The paste-like constituent described above may be solder cream or the like.

The melting point of the low-melting metal 10 is preferably 180° C. or less, more preferably 60 to 180° C., and still more preferably 120 to 145° C.

The ratio of metal particles in the paste-like constituent is preferably 30 vol % to 95 vol % and more preferably 40 vol % to 90 vol %. When the ratio of metal particles falls within the range described above, the thermal conductive efficiency between the electronic component 9 and the metal layer 8 becomes good and the printability of the paste-like constituent becomes good.

In addition, high-melting metal may be added to the paste-like constituent as necessary. Since alloy between the low-melting metal 10 and the high-melting metal can be formed when the low-melting metal 10 is melted, the electronic component 9 can be firmly connected to the electrically conductive path 4 and the metal layer 8.

The melting point of the high-melting metal is preferably 800° C. or more, more preferably 800 to 1500° C., and still more preferably 900 to 1100° C.

In addition, the high-melting metal preferably includes at least one selected from a group including copper, silver, gold, nickel, silver-coated copper, and silver-coated copper alloy. These metals have good conductivity. Accordingly, the conductivity between the electrically conductive path 4 and the electronic component 9 can be improved.

In addition, the thermally conductive resin constituent 7 instead of the low-melting metal 10 may be used to connect the electronic component 9 to the metal layer 8.

The thermally conductive resin constituent 7 described above may be used as the thermally conductive resin constituent 7. When the thermally conductive resin constituent 7 is applied to or placed on the surface of the electrically conductive path 4 and the surface of the metal layer 8, the paste-like or sheet-like thermally conductive resin constituent 7 may be used. When the paste-like thermally conductive resin constituent 7 is applied or placed, a screen suited for the shape of the electrically conductive path 4 or the metal layer 8 may be used for printing and application. When the sheet-like thermally conductive resin constituent 7 is applied or placed, the thermally conductive resin constituent 7 may be cut so as to match the shape of the electrically conductive path 4 or the metal layer 8.

The electronic component 9 may include, for example, a semiconductor circuit sealed by a sealant and a terminal exposed from the surface of the sealant. The terminal is made of a conductive material such as metal and electrically connects the semiconductor circuit to the electrically conductive path 4. In addition, the terminal is connected to the metal layer 8 via the low-melting metal 10 provided on the metal layer 8. Heat generated from the semiconductor circuit is conducted from the terminal to the thermally conductive resin constituent 7 and the heat dissipation member 6 via the low-melting metal 10 and the metal layer 8 and dissipated outside the circuit structure body.

Figure 4:
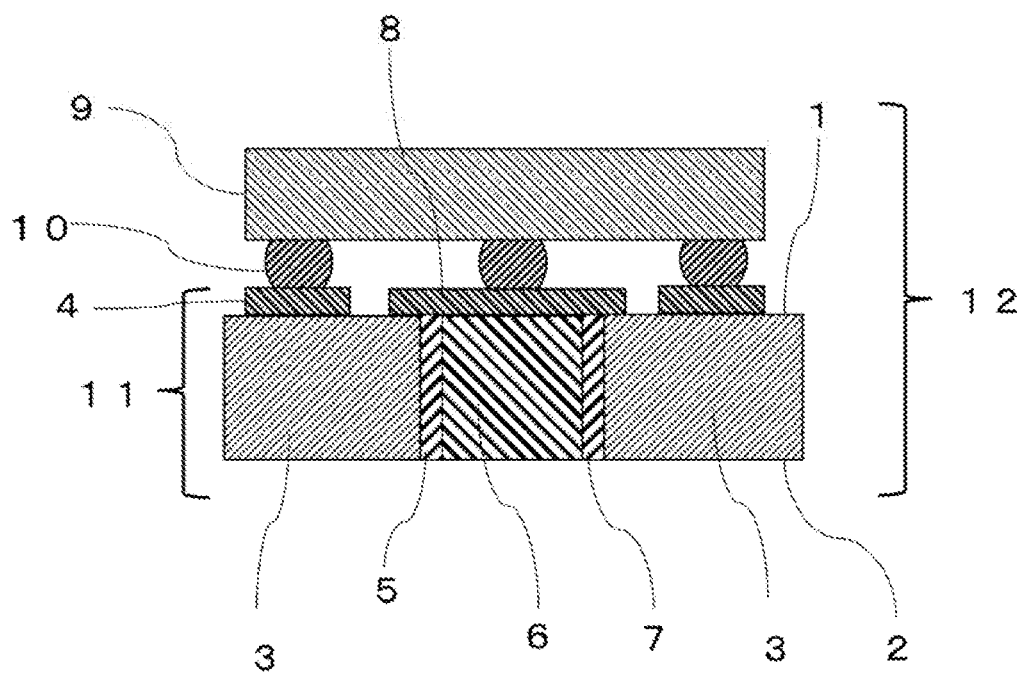
FIG. 4 is a schematic cross sectional view illustrating a heat dissipation circuit structure body according to a second embodiment of the invention.
Figure 5:
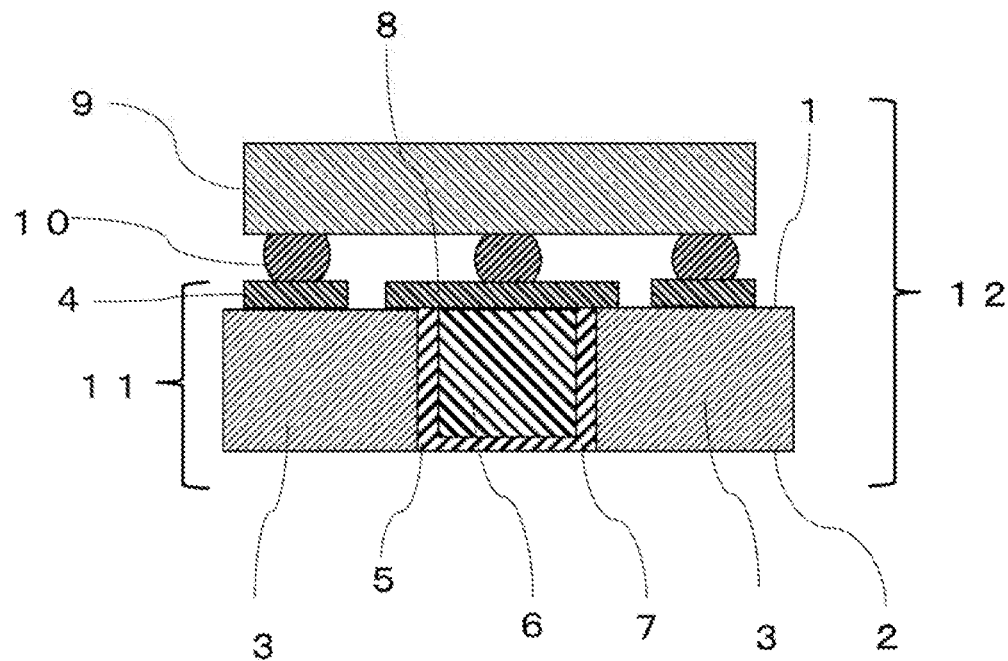
FIG. 5 is a schematic cross sectional view illustrating a heat dissipation circuit structure body according to a modification of the second embodiment of the invention.

FIGS. 4 and 5 illustrate the heat dissipation substrate 11 and the heat dissipation circuit structure body 12 according to a second embodiment of the invention.

As illustrated in these drawings, the heat dissipation substrate 11 according to the embodiment includes the base substrate 3 having the first surface 1 and the second surface 2, the electrically conductive path 4 formed on the first surface, the through-hole 5 penetrating from the first surface 1 to the second surface 2, the heat dissipation member 6 inserted into the through-hole 5, and the thermally conductive resin constituent 7 that is present, without space, between the inner peripheral surface of the through-hole 5 and the outer peripheral surface of the heat dissipation member 6 surrounded by this inner peripheral surface, in which the heat dissipation member 6 and the thermally conductive resin constituent 7 exposed to the first surface from the through-hole 5 are formed on substantially the same plane as the first surface 1 and the metal layer 8 is provided on the thermally conductive resin constituent 7 exposed to the first surface.

Since the surfaces of the heat dissipation member 6 and the thermally conductive resin constituent 7 are disposed on substantially the same plane as the first surface 1, if the electrically conductive path 4 and the metal layer 8 are formed on the surfaces of the heat dissipation member 6 and the thermally conductive resin constituent 7 at the same time, the thickness of the electrically conductive path 4 can be substantially the same as the thickness of the metal layer 8 easily. In addition, the surfaces of the electrically conductive path 4 and the metal layer 8 formed at the same time can be easily disposed on substantially the same plane. Accordingly, when the electronic component 9 is connected to the electrically conductive path 4 and the metal layer 8 via the low-melting metal 10, the distance between the electronic component 9 and the electrically conductive path 4 and the distance between the electronic component 9 and the metal layer 8 become even.

In addition, the metal layer 8 only needs to cover at least a part of the through-hole 5, the heat dissipation member 6, the thermally conductive resin constituent 7 in plan view of the first surface 1, but the metal layer 8 preferably covers all of the through-hole 5, the heat dissipation member 6, and the thermally conductive resin constituent 7. Since the metal layer 8 is formed as described above, heat generated from the electronic component 9 is easily and efficiently conducted to the thermally conductive resin constituent 7 and the heat dissipation member 6 without a loss.

In addition, as illustrated in FIG. 4, the heat dissipation member 6 and the thermally conductive resin constituent 7 may be formed on substantially the same plane as the second surface 2 on the side of the second surface 2. Alternatively, as illustrated in FIG. 5, the thermally conductive resin constituent 7 and the second surface 2 may be disposed on substantially the same plane with the heat dissipation member 6 not exposed to the surface on the side of second surface.

It should be noted here that the other structure and operation are the same as in the first embodiment above, so descriptions thereof are omitted.

Figure 6:
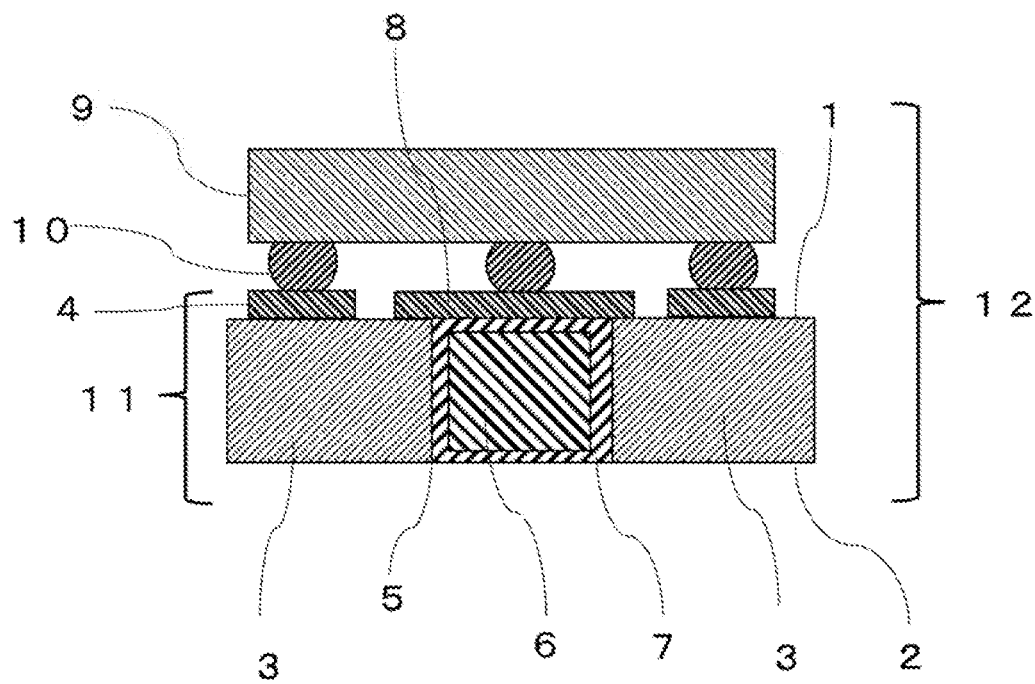
FIG. 6 is a schematic cross sectional view illustrating a heat dissipation circuit structure body according to a third embodiment of the invention.

FIG. 6 illustrates the heat dissipation substrate 11 and the heat dissipation circuit structure body 12 according to a third embodiment of the invention.

As illustrated in this drawing, the heat dissipation substrate 11 according to the embodiment includes the base substrate 3 having the first surface 1 and the second surface 2, the electrically conductive path 4 formed on the first surface, the through-hole 5 penetrating from the first surface 1 to the second surface 2, the heat dissipation member 6 inserted into the through-hole 5, and the thermally conductive resin constituent 7 that is present, without space, between the inner peripheral surface of the through-hole 5 and the outer peripheral surface of the heat dissipation member 6 surrounded by the inner peripheral surface, in which the thermally conductive resin constituent 7 exposed to the first surface from the through-hole 5 is formed on substantially the same plane as the first surface 1 and the metal layer 8 is provided on the thermally conductive resin constituent 7 exposed to the first surface.

Since the surface of the thermally conductive resin constituent 7 is disposed on substantially the same plane as the first surface 1, if the electrically conductive path 4 and the metal layer 8 are formed on the surface of the thermally conductive resin constituent 7 at the same time, the thickness of the electrically conductive path 4 can be substantially the same as the thickness of the metal layer 8. In addition, the surfaces of the electrically conductive path 4 and the metal layer 8 formed at the same time can be easily disposed on substantially the same plane. Accordingly, when the electronic component 9 is connected to the electrically conductive path 4 and the metal layer 8 via the low-melting metal 10, the distance between the electronic component 9 and the electrically conductive path 4 and the distance between the electronic component 9 and the metal layer 8 become even.

In addition, although the metal layer 8 in plan view of the first surface 1 only needs to cover at least a part of the through-hole 5 and the thermally conductive resin constituent 7, the metal layer 8 preferably covers all of the through-hole 5 and the thermally conductive resin constituent 7. Since the metal layer 8 is formed as described above, heat generated from the electronic component 9 is easily and efficiently conducted to the thermally conductive resin constituent 7 and the heat dissipation member 6 without a loss.

It should be noted here that the other structure and operation are the same as in the first embodiment and the second embodiment above, so descriptions thereof are omitted.

Next, the method for manufacturing the heat dissipation circuit structure body 12 according to the first embodiment of the invention will be described.

Figure 8:
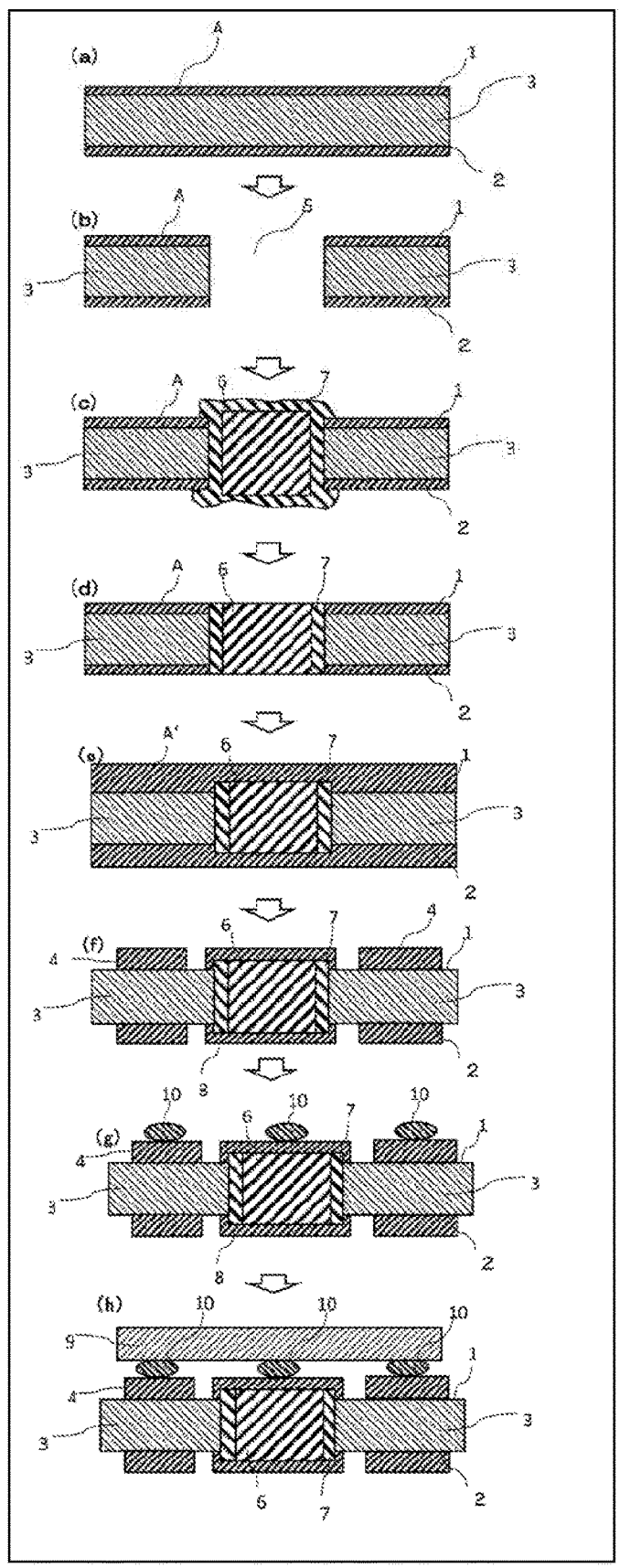
FIG. 8 is a schematic view illustrating an example of a method for manufacturing the heat dissipation circuit structure body according to the first embodiment of the invention.

First, as illustrated in FIG. 8(a), the metal films A are formed on the first surface 1 and the second surface 2 of the base substrate 3.

The method for forming the metal films A is not particularly limited and may be a known method such as an additive method including plating or vapor deposition, a method for printing and hardening an electrically conductive paste including metal particles or metal nanoparticles. Of these methods, the forming method using plating is preferable in that the metal films A are formed easily.

Next, the through-hole 5 penetrating from the outer surface of the metal film A formed on the first surface 1 to the outer surface of the metal film A formed on the second surface 2 is provided in the base substrate 3 illustrated in FIG. 8(a) to manufacture the base substrate 3 having the through-hole 5 (FIG. 8(b)). The method for providing the through-hole 5 in the base substrate 3 is not particularly limited, but a method that uses a cutting tool such as a drill or a method that provides the through-hole 5 using a carbon dioxide gas laser, a YAG laser, or the like can be adopted.

Next, the thermally conductive resin constituent 7 and the heat dissipation member 6 are inserted into the through-hole 5 provided in the base substrate 3. Specifically, the base substrate 3 having the through-hole 5 may be filled with the thermally conductive resin constituent 7 and then the heat dissipation member 6 may be inserted into the through-hole 5 or a thermally conductive resin constituent-covered heat dissipation member 6A may be inserted into the through-hole 5.

After the heat dissipation member 6 is pushed into the through-hole 5, the heat dissipation member 6 can be fixed to the base substrate 3 by hardening the thermally conductive resin constituent 7 via heating or the like.

Immediately after the heat dissipation member 6 is fixed to the base substrate 3, the surfaces of the heat dissipation member 6 and the thermally conductive resin constituent 7 are not disposed on substantially the same plane as the metal film A as illustrated in FIG. 8(c). Accordingly, the surface of the thermally conductive resin constituent 7 is machined so as to be disposed on substantially the same plane as the metal film A (FIG. 8(d)). The method for machining the surface of the thermally conductive resin constituent 7 so that the surface is disposed on substantially the same plane as the metal film A may be a known method such as, for example, cutting work or grinding work. Alternatively, a method can be used in which, after the thermally conductive resin constituent-covered heat dissipation member 6 is inserted into the through-hole 5 and the thermally conductive resin constituent 7 and the base substrate 3 provided with the metal film A are pressed, so that they are disposed on substantially the same plane concurrently with the insertion of the heat dissipation member 6 into the through-hole 5.

The press machine may be a press machine generally used to fix the heat dissipation member 6 or a vacuum press machine. The press condition is not limited, but the thermally conductive resin constituent 7 is preferably hardened under the condition that, for example, the temperature is 150 to 190° C., the surface pressure is 5 to 15 kg/cm$^2$, and the time is 30 to 120 minutes.

Next, as illustrated in FIG. 8(e), the metal film A' is further formed on the surfaces of the thermally conductive resin constituent 7 and the metal film A using, for example, an additive method such as plating, resist printing or the like is performed to form the electrically conductive path 4 and the metal layer 8 as illustrated in FIG. 8(f), and the heat dissipation substrate 11 is obtained.

Next, as illustrated in FIG. 8(g), the low-melting metal 10 is placed on the electrically conductive path 4 and the metal layer 8.

The method for placing the low-melting metals 10 on the electrically conductive path 4 and the metal layer 8 may be a method that places, for example, metal particles (such as solder balls) on the electrically conductive path 4 and the metal layer 8 or a method that screen-prints a paste-like constituent including the low-melting metals 10 (such as solder cream). In addition, a method that attaches a paste-like constituent to the terminal of the electronic component 9 using a transfer method or the like and places the low-melting metals 10 on the electrically conductive path 4 and the metal layer 8 may be used.

Next, as illustrated in FIG. 8(h), the electrically conductive path 4 and the metal layer 8 are connected to the electronic component 9 via the low-melting metals 10 to obtain the heat dissipation circuit structure body 12.

The method for connecting the electrically conductive path 4 and the metal layer 8 to the electronic component 9 via the low-melting metals 10 may be, for example, a method that connects the electrically conductive path 4 and the metal layer 8 to the electronic component 9 in a solder reflow process.

Since the electronic component 9, the electrically conductive path 4, and the metal layer 8 are connected via the low-melting metals 10 in the heat dissipation circuit structure body 12 obtained as described above, heat generated from the electronic component 9 can be dissipated efficiently from the circuit structure body via the thermally conductive resin constituent 7 and the heat dissipation member 6 in addition to its good bonding strength and connection stability.

Next, a method for manufacturing the heat dissipation circuit structure body 12 according to the second embodiment of the invention will be described.

Figure 9:
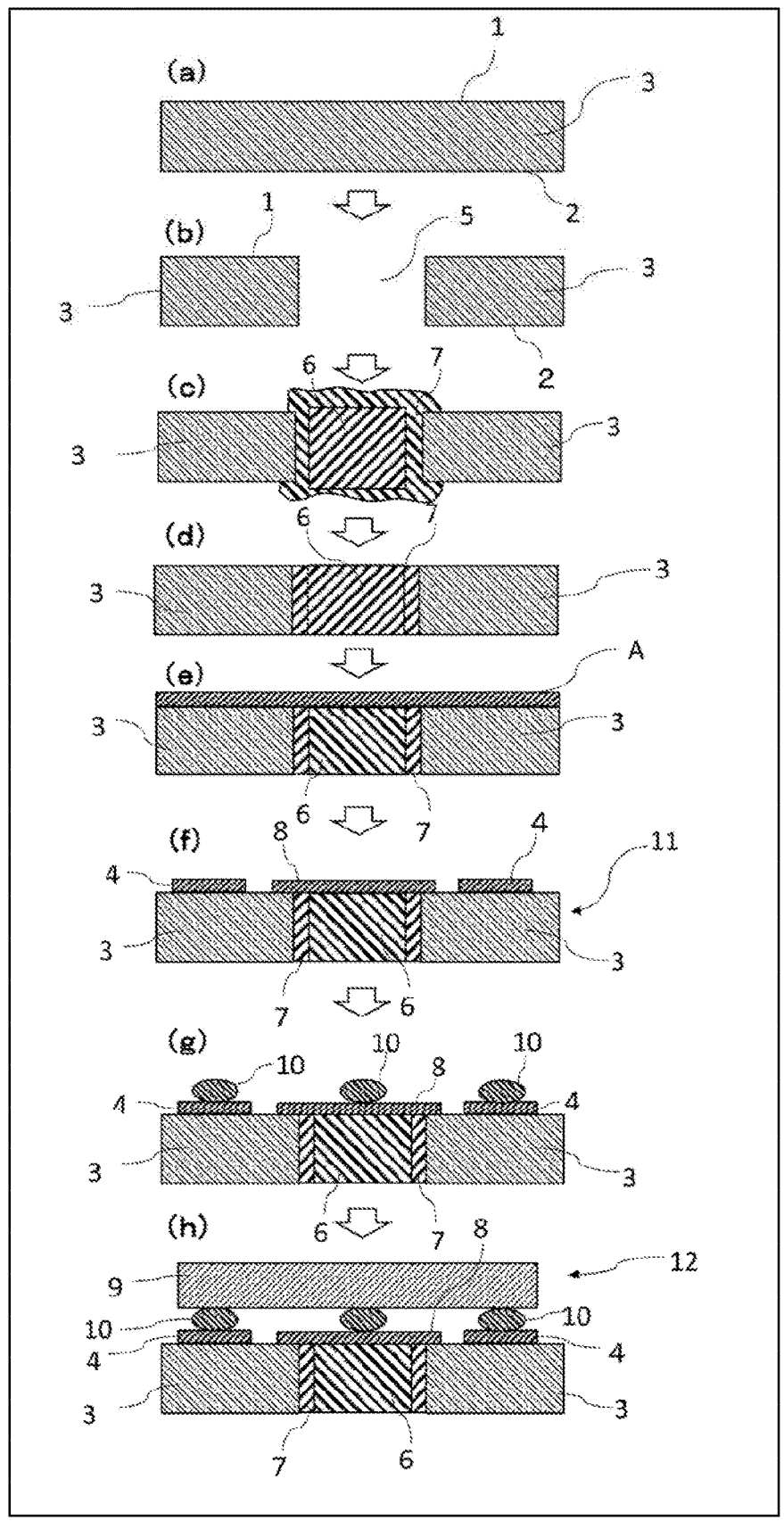
FIG. 9 is a schematic view illustrating an example of a method for manufacturing the heat dissipation circuit structure body according to the second embodiment of the invention.

First, the base substrate 3 having the through-hole 5 penetrating from the first surface 1 to the second surface 2 is manufactured based on the base substrate 3 illustrated in FIG. 9(a) (FIG. 9(b)).

Next, the thermally conductive resin constituent 7 and the heat dissipation member 6 are inserted into the through-hole 5 provided in the base substrate 3. After the insertion, the heat dissipation member 6 can be fixed to the base substrate 3 by hardening the thermally conductive resin constituent 7 via heating or the like.

Immediately after the heat dissipation member 6 is fixed to the base substrate 3, the surfaces of the heat dissipation member 6 and the thermally conductive resin constituent 7 are not disposed on substantially the same plane as the first surface 1 of the base substrate 3 as illustrated in FIG. 9(c). Accordingly, the surface of the thermally conductive resin constituent 7 is machined so as to be disposed on substantially the same plane as the first surface 1 of the base substrate 3 (FIG. 9(d)).

Next, as illustrated in FIG. 9(e), the metal film A is formed on the base substrate 3, the heat dissipation member 6, and the thermally conductive resin constituent 7.

After that, as illustrated in FIG. 9(f), the electrically conductive path 4 and the metal layer 8 are formed by performing resist printing or the like to obtain the heat dissipation substrate 11.

Next, the low-melting metals 10 are placed on the electrically conductive path 4 and the metal layer 8 as illustrated in FIG. 9(g) and then the electrically conductive path 4 and the metal layer 8 are connected to the electronic component 9 via the low-melting metals 10 as illustrated in FIG. 9(h) to obtain the heat dissipation circuit structure body 12.

Next, the method for manufacturing the heat dissipation circuit structure body 12 according to the third embodiment of the invention will be described.

Figure 10:
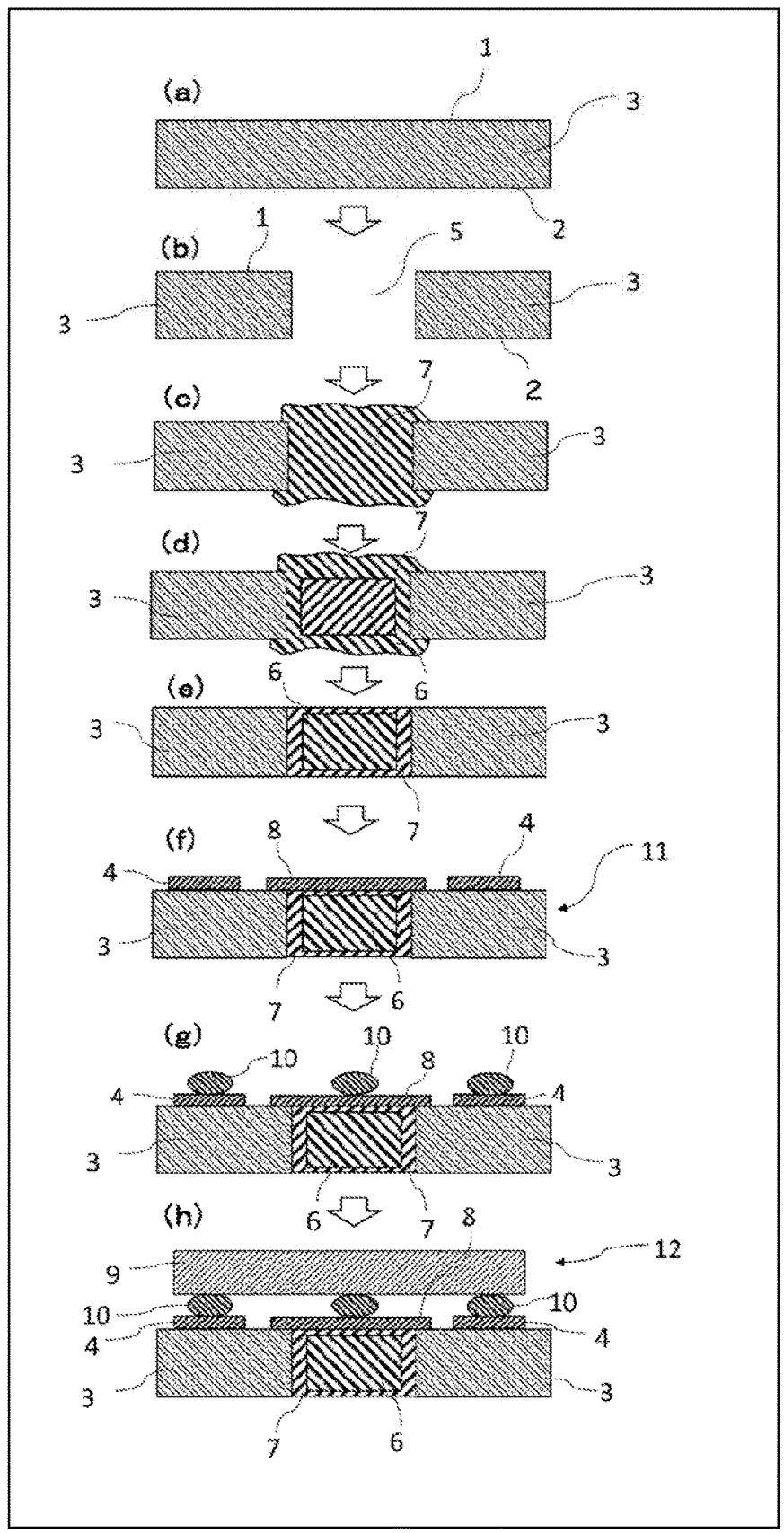
FIG. 10 is a schematic view illustrating an example of a method for manufacturing the heat dissipation circuit structure body according to the third embodiment of the invention.

First, the through-hole 5 penetrating from the first surface 1 to the second surface 2 is provided in the base substrate 3 illustrated in FIG. 10(a) to manufacture the base substrate 3 (FIG. 10(b)).

Next, the thermally conductive resin constituent 7 and the heat dissipation member 6 are inserted into the through-hole 5 provided in the base substrate 3. Specifically, as illustrated in FIG. 10(c), the base substrate 3 having the through-hole 5 is filled with the thermally conductive resin constituent 7.

Next, as illustrated in FIG. 10(d), the heat dissipation member 6 is inserted into the through-hole 5. After pushing the heat dissipation member 6 into the through-hole 5, the heat dissipation member 6 can be fixed to the base substrate 3 by hardening the thermally conductive resin constituent 7 via heating or the like.

Immediately after the heat dissipation member 6 is fixed to the base substrate 3, the surface of the thermally conductive resin constituent 7 and the first surface 1 of the base substrate 3 are not disposed on substantially the same plane as illustrated in FIG. 10(d). Accordingly, the surface of the thermally conductive resin constituent 7 is machined so as to be disposed on substantially the same plane as the first surface 1 of the base substrate 3 (FIG. 10(e)).

Next, as illustrated in FIG. 10(f), the electrically conductive path 4 and the metal layer 8 are formed on the surfaces of the thermally conductive resin constituent 7 and the base substrate 3 to obtain the heat dissipation substrate 11.

The method for forming the electrically conductive path 4 and the metal layer 8 is not particularly limited and may be a known method such as an additive method including plating or vapor deposition, a method for printing and hardening an electrically conductive paste including metal particles or metal nanoparticles. Of these methods, the forming method using plating is preferable in that the electrically conductive path 4 and the metal layer 8 are easily formed. After the electrically conductive path 4 and the metal layer 8 are formed by plating, the metal layer 8 and the electrically conductive path 4 having any pattern can be obtained by performing resist printing or the like.

In addition, when the electrically conductive path 4 and the metal layer 8 are formed by printing and hardening an electrically, the electrically conductive paste can be printed and hardened using the screens suited for the shapes of the electrically conductive path 4 and the metal layer 8.

Next, as illustrated in FIG. 10(g), the low-melting metal 10 is placed on the electrically conductive path 4 and the metal layer 8.

Next, as illustrated in FIG. 10(h), the electrically conductive path 4 and the metal layer 8 are connected to the electronic component 9 via the low-melting metal 10 to obtain the heat dissipation circuit structure body 12.

In addition, the method for fixing the thermally conductive resin constituent 7 and the heat dissipation member 6 to the through-hole 5 illustrated in FIGS. 10(c) to 10(e) may be another method.

For example, the base substrate 3 having the through-hole 5 penetrating from the first surface 1 to the second surface 2 of the base substrate 3 as illustrated in FIG. 11(a) is preheated and the thermally conductive resin constituent-covered heat dissipation member 6A, which is obtained by covering the heat dissipation member 6 with the thermally conductive resin constituent 7 in advance, is inserted into the through-hole 5 of the base substrate 3 as illustrated in FIG. 11(b). Although the surface of the thermally conductive resin constituent 7 and the first surface 1 of the base substrate 3 are not present on substantially the same plane immediately after the heat dissipation member 6A is inserted into the through-hole 5, machining can be performed by the same method as above so that these surfaces are present on substantially the same plane (FIG. 11(c)).

The temperature at which the base substrate 3 described above is preheated is not particularly limited, but the temperature is preferably 40 to 90° C. and more preferably 50 to 80° C. When the base substrate 3 is preheated as described above, since the thermally conductive resin constituent 7 having applied to the heat dissipation member 6 is softened by heat when the thermally conductive resin constituent-covered heat dissipation member 6A is inserted into the through-hole 5 of the base substrate 3 described above, the insertion becomes easier.

Here, the thermally conductive resin constituent-covered heat dissipation member 6A is obtained by covering a part or all of the surface of the heat dissipation member 6 with the thermally conductive resin constituent 7 described above.

The method for manufacturing the thermally conductive resin constituent-covered heat dissipation member 6A is not particularly limited, but the thermally conductive resin constituent-covered heat dissipation member 6A may be manufactured by, for example, a dipping method. In the case of the dipping method, the heat dissipation member 6 is soaked in a solution obtained by dissolving the thermally conductive resin constituent 7 in a solvent, the heat dissipation member 6 is taken out of the solution, and the solvent is dried and removed to manufacture the thermally conductive resin constituent-covered heat dissipation member 6A in which the entire surface of the heat dissipation member 6 is covered with the thermally conductive resin constituent 7. It should be noted here that a part of the surface of the heat dissipation member 6 may be covered with a tape or the like as necessary before the heat dissipation member 6 is soaked in the solution described above. This enables the position at which the dissipation material is covered with the thermally conductive resin constituent 7 and the area of the coverage to be designed freely.

Figure 12:
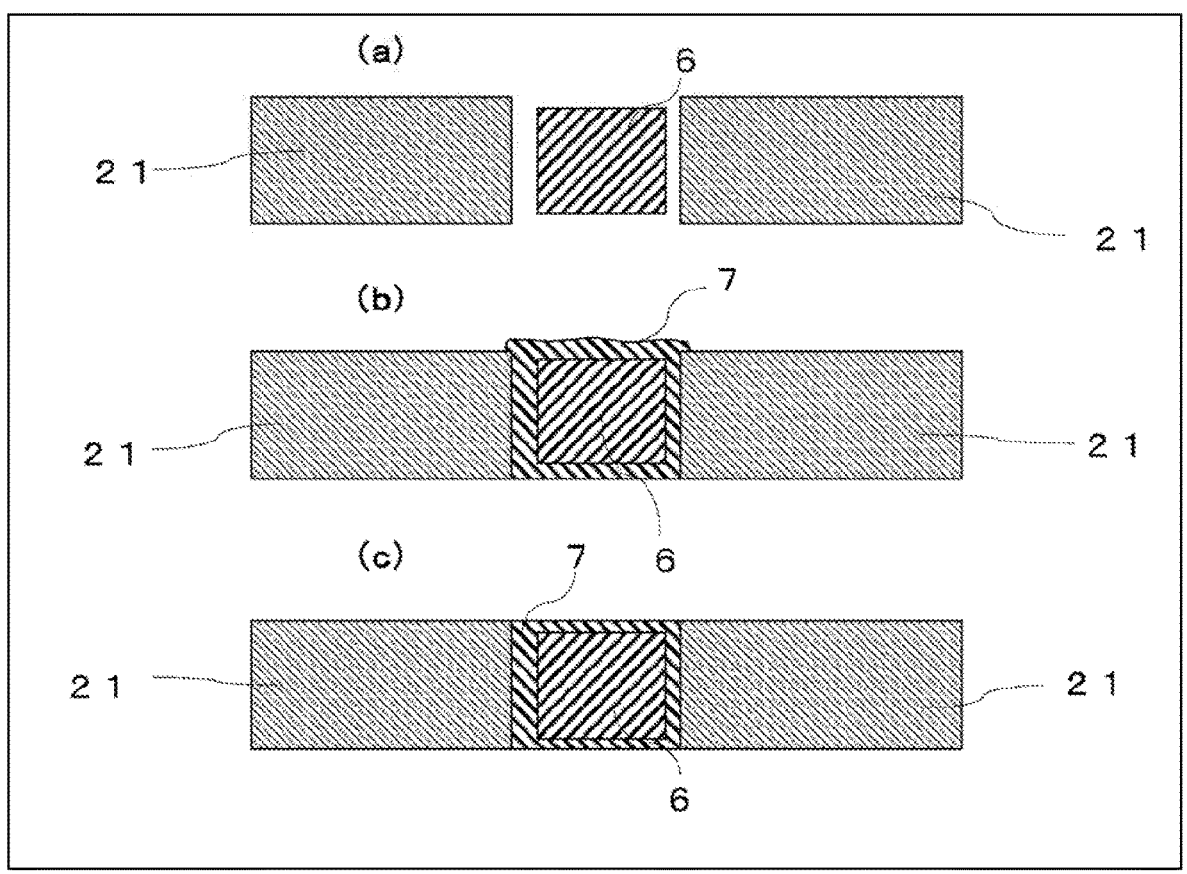
FIG. 12 is a cross sectional view illustrating an example of a method for manufacturing a thermally conductive resin constituent-covered heat dissipation member according to the invention.

It is possible to use another manufacturing method that, for example, inserts the heat dissipation member 6 into a fluororesin sheet 21 having a hole as illustrated in FIG. 12(a), supplies the thermally conductive resin constituent 7 into the space between the hole and the heat dissipation member 6 as illustrated in FIG. 12(b), removes the excess part of the thermally conductive resin constituent 7 as illustrated in FIG. 12(c), dries and removes the solvent, and then takes the heat dissipation member from the fluororesin sheet 21.

The condition under which the solvent is dried and removed is not particularly limited in any methods, but the solvent is preferably dried and removed at 50 to 80° C. for 30 to 120 minutes and more preferably at 50° C. for 30 to 60 minutes.

When the thermally conductive resin constituent 7 has moderate viscosity, pressing can be performed while preventing the thermally conductive resin constituent 7 from excessively flowing out of the space between the base substrate 3 and the heat dissipation member 6 and the heat dissipation member can be easily fixed to the base substrate 3.

It should be noted here that the method for using the thermally conductive resin constituent 7 described above is not limited to the above method and, for example, the thermally conductive resin constituent 7 may be inserted into the base substrate 3 without the solvent being dried and removed after the thermally conductive resin constituent 7 is applied to the heat dissipation member 6.

In addition, the thermally conductive resin constituent 7 can be used by applying the thermally conductive resin constituent 7 to a mold releasing film or the like, drying and removing the solvent, and forming the thermally conductive resin constituent 7 in a film.

In addition, when the thermally conductive resin constituent-covered heat dissipation member 6A is inserted into the base substrate 3 and then pressed, the thermally conductive resin constituent-covered heat dissipation member 6 can also be temporally fixed to the base substrate 3 by plastic deformation of an adhesive constituent instead of hardening via heating.

EXAMPLE

Although an example of the invention will be illustrated below, the invention is not limited by the following example. It should be noted here that the formulation ratio or the like used below is based on a mass unless otherwise specified.

A thermally conductive resin constituent-covered heat dissipation member was manufactured by pasting tapes to the upper surface and the bottom of a heat dissipation member, made of a hybrid material including copper, porous copper, and carbon fiber, that has a columnar shape of a diameter of $\phi 5.88$ mm and a thickness of 1.5 mm, applying a thermally conductive resin constituent to a side peripheral surface using a dipping method, and drying the thermally conductive resin constituent at 40° C. for one hour, and removing the tapes.

The metal film A was provided on the FR-4 (Flame Retardant Type 4) substrate (base substrate) using plating and then a through-hole, having a diameter of $\phi 6.0$ mm and a depth of 1.5 mm, that underwent through-hole plating was formed. The obtained thermally conductive resin constituent-covered heat dissipation member was embedded in the through-hole and pressed at a maximum temperature of 190° C. and a surface pressure of 10 kg/cm$^2$ for one hour with a press machine. After the metal film A' was provided by plating, an electrically conductive path and a metal layer were formed by etching to manufacture a heat dissipation substrate having the structure illustrated in FIG. 1.

As the thermally conductive resin constituent, a mixture of the following resin components (resin or resin solution), curing agent, and silver-coated copper powder (inorganic filler) at the ratio (parts by mass) described below was used. It should be noted here that the volume percentage of silver-coated copper powder can be calculated by assuming that the density of silver-coated copper powder is 9.1 g/cm$^3$ and the density of the other materials is 1.1 g/cm$^3$. In addition, the complex viscosity of the thermally conductive resin constituent at 80° C. was measured as 8.00E+05 Pa·s.

Solid epoxy resin: trisphenol epoxy resin, "VG3101L" manufactured by Printec Co., 50% by mass methyl ethyl ketone solution (70 parts)

Liquid epoxy resin: bisphenol F-type epoxy resin, "EP-4901E" manufactured by ADEKA Corporation (30 parts)

Imidazole-based curing agent: "2E4MZ (2-ethyl-4-methyl imidazole)" manufactured by SHIKOKU CHEMICALS Corporation (6 parts)

Silver-coated copper powder: silver-coated amount 10% by mass (50.6 vol %), spherical, average particle diameter 5 µm (900 parts)

The space evaluation and the measurement of the adhesion strength between the thermally conductive resin constituent-covered heat dissipation member and the through-hole plating were performed in the following method for the obtained heat dissipation substrate.

In the space evaluation between the thermally conductive resin constituent-covered heat dissipation member and the through-hole plating, the cross-section of the heat dissipation substrate was observed by an optical microscope (magnification: 80 fold) to confirm that there was no space between the thermally conductive resin constituent-covered heat dissipation member and the through-hole plating.

As for the heat dissipation substrate and the solder-dipped heat dissipation substrate, the adhesive strength until thermally conductive resin constituent-covered heat dissipation member was removed was measured by pushing a metal rod having a diameter of $\phi 2.5$ mm against the part of the thermally conductive resin constituent-covered heat dissipation member and pushing the metal rod into the through-hole at 20 mm/min. Although this strength is preferably 100 N or more, the strength was measured as 200 N or more for both substrates.

REFERENCE SIGNS LIST

1: first surface
2: second surface
3: base substrate
4: electrically conductive path 5: through-hole
6: heat dissipation member
6A: thermally conductive resin constituent-covered heat dissipation member
7: thermally conductive resin constituent
8: metal layer
9: electronic component
10: low-melting metal
11: heat dissipation substrate
12: heat dissipation circuit structure body
21: fluororesin sheet
A: metal film

The invention claimed is:

1. A heat dissipation substrate comprising:
a base substrate including a first surface and a second surface;
an electrically conductive path formed on the first surface;
a through-hole penetrating from the first surface to the second surface;
a heat dissipation member inserted into the through-hole, at least a part of the heat dissipation member projecting from the first surface;
a thermally conductive resin constituent covering a side surface of the heat dissipation member, the thermally conductive resin constituent being present, without space, between an inner peripheral surface of the through-hole and an outer peripheral surface of the heat dissipation member surrounded by the inner peripheral surface, wherein the thermally conductive resin constituent comprises at least one of inorganic filler selected from the group consisting of gold powder, silver powder, copper powder, nickel powder, alloy powder including two or more metals selected from gold, silver, copper, and nickel, silver-coated copper powder, gold-coated copper powder, silver-coated nickel powder, gold-coated nickel powder, graphene, and carbon; and
a metal layer covering the heat dissipation member projecting from the first surface,
wherein an outer surface of the metal layer and an outer surface of the electrically conductive path are disposed on substantially the same plane.

2. The heat dissipation substrate according to claim 1, wherein the heat dissipation member projects from the second surface of the base substrate.

3. A heat dissipation circuit structure body comprising:
the heat dissipation substrate according to claim 1; and
an electronic component connected to the electrically conductive path and the metal layer of the heat dissipation substrate.

4. A method for manufacturing a heat dissipation substrate, the method comprising:
a process of obtaining a metal laminated body by providing a first metal film on a first surface of a base substrate including the first surface and a second surface;
a process of forming a through-hole penetrating through the metal laminated body from an outer surface of the first metal film of the metal laminated body to the second surface of the base substrate;
a process of achieving a state in which a heat dissipation member is inserted into the through-hole, a part of the heat dissipation member projects from the outer surface of the first metal film, a thermally conductive resin constituent is present, without space, between an inner peripheral surface of the through-hole and the heat dissipation member, and a side surface of the heat dissipation member is covered with the thermally conductive resin constituent;
a process of hardening the thermally conductive resin constituent;
a process of performing machining so that an outer surface of the first metal film, an outer surface of the thermally conductive resin constituent, and an outer surface of the heat dissipation member are disposed on substantially the same plane, wherein the thermally conductive resin constituent comprises at least one of inorganic filler selected from the group consisting of gold powder, silver powder, copper powder, nickel powder, alloy powder including two or more metals selected from gold, silver, copper, and nickel, silver-coated copper powder, gold-coated copper powder, silver-coated nickel powder, gold-coated nickel powder, graphene, and carbon;
a process of forming a second metal film that covers a surface of the first metal film, a surface of the heat dissipation member, and a surface of the thermally conductive resin constituent; and
a process of providing an electrically conductive path and a metal layer covering the outer surface of the heat dissipation member by removing a part of the second metal film to form an arbitrary pattern.

5. A heat dissipation circuit structure body comprising:
the heat dissipation substrate according to claim 2; and
an electronic component connected to the electrically conductive path and the metal layer of the heat dissipation substrate.

6. The heat dissipation substrate according to claim 1, wherein:
said thermally conductive resin constituent directly contacts said outer peripheral surface of the heat dissipation member and directly contacts said inner peripheral surface of the through-hole and completely fills, without an open space, an entire region between said outer peripheral surface of the heat dissipation member and said inner peripheral surface of the through-hole.

7. The heat dissipation substrate according to claim 1, wherein:
said thermally conductive resin constituent covers substantially said entire side surface of the heat dissipation member.

8. The method for manufacturing a heat dissipation substrate heat dissipation substrate according to claim 4, wherein:
said process of achieving a state includes achieving a state in which the thermally conductive resin constituent directly contacts said outer peripheral surface of the heat dissipation member and directly contacts said inner peripheral surface of the through-hole and completely fills, without an open space, an entire region between said outer peripheral surface of the heat dissipation member and said inner peripheral surface of the through-hole.

9. The method for manufacturing a heat dissipation substrate heat dissipation substrate according to claim 8, wherein:
said process of achieving a state includes achieving a state in which said thermally conductive resin constituent covers substantially said entire side surface of the heat dissipation member.

10. The heat dissipation substrate according to claim 1, wherein:

both the heat dissipation member and the thermally conductive resin project from the first surface and the projecting parts of both the heat dissipation member and the thermally conductive resin are covered with the metal layer.

11. The heat dissipation substrate according to claim 10, wherein:
at least a part of the projecting part of the heat dissipation member is not covered with the thermally conductive resin and contacts the metal layer.

* * * * *